(12) United States Patent
Sota

(10) Patent No.: US 6,201,707 B1
(45) Date of Patent: Mar. 13, 2001

(54) WIRING SUBSTRATE USED FOR A RESIN-SEALING TYPE SEMICONDUCTOR DEVICE AND A RESIN-SEALING TYPE SEMICONDUCTOR DEVICE STRUCTURE USING SUCH A WIRING SUBSTRATE

(75) Inventor: Yoshiki Sota, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/318,796

(22) Filed: May 26, 1999

(30) Foreign Application Priority Data

May 28, 1998 (JP) .................................................. 10-146785

(51) Int. Cl.$^7$ ...................................................... H05K 1/18
(52) U.S. Cl. ...................... 361/761; 174/52.4; 174/260; 174/261; 174/263; 257/712; 257/724; 257/737; 257/738; 257/774; 257/760; 257/778; 257/783; 361/760; 361/767; 361/771; 361/783; 361/761
(58) Field of Search .................................. 174/52.4, 260, 174/263, 261; 257/712, 724, 774, 737, 738, 778, 690; 361/760, 783, 757, 771, 761

(56) References Cited

U.S. PATENT DOCUMENTS

| 5,889,324 | * | 3/1999 | Suzuki ................................. 257/712 |
| 6,097,610 | * | 8/2000 | Hashimoto ........................... 361/760 |

FOREIGN PATENT DOCUMENTS

| 63-51449 U | 4/1988 | (JP) . |
| 9-121002 | 5/1997 | (JP) . |

\* cited by examiner

Primary Examiner—Jeffrey Gaffin
Assistant Examiner—Thanh Y. Tran
(74) Attorney, Agent, or Firm—Nixon & Vanderhye, P.C.

(57) ABSTRACT

A wiring substrate used for a resin-sealing type semiconductor device is provided with an insulating substrate in which a through hole used for connecting an external terminal is formed, a wiring pattern formed on a semiconductor-chip packaging surface side of the insulating substrate, a land section that is formed at an end of the wiring pattern in a manner so as to cover the through hole from the semiconductor-chip packaging surface side, and that is used for connecting the external connecting terminal to the wiring pattern from the surface side opposite to the above-mentioned semiconductor-chip packaging surface side of the insulating substrate, and a through-hole opening section that allows the through hole to be partially open on the semiconductor-chip packaging surface side. This arrangement makes it possible to prevent problems of separation and swelling of resin caused by bubbles and moisture expanded by heat, which reside in the interface between the wiring substrate used for the resin-sealing type semiconductor device and the semiconductor chip packaged on the wiring substrate used for the resin-sealing type semiconductor device.

11 Claims, 7 Drawing Sheets

WIRING SUBSTRATE USED FOR A RESIN-SEALING TYPE SEMICONDUCTOR DEVICE AND A RESIN-SEALING TYPE SEMICONDUCTOR DEVICE STRUCTURE USING SUCH A WIRING SUBSTRATE

FIELD OF THE INVENTION

The present invention relates to a wiring substrate used for a resin-sealing type semiconductor device and a resin-sealing type semiconductor device structure using such a wiring substrate.

BACKGROUND OF THE INVENTION

In recent years, along with the development of portable apparatuses, etc., miniaturization and light weight of these apparatuses have been achieved remarkably. In response to these trends, there have been ever-increasing demands for semiconductor devices which are assembled into a small package of a BGA (Ball Grid Array) type called CSP (Chip Size Package or Chip Scale Package).

This package of the BGA type has a structure in which ball-shaped external terminals that are arranged on the under surface of the package in the form of an area array are joined to a packaging substrate when a semiconductor is installed on the packaging substrate. With respect to the packaging method for the above-mentioned package, a batch reflow process, etc. is generally carried out together with other electronic parts.

With respect to the structure of a resin-sealing type semiconductor device of the BGA type called CSP, a structure of CSP, which has been currently mass-produced, is disclosed in Japanese Laid-Open Patent Application 121002/1997 (Tokukaihei 9-121002) (Published on May 6, 1997). In this semiconductor device, a semiconductor chip is packaged on an insulating wiring substrate.

In this insulating wiring substrate, a wiring pattern is formed on the chip packaging surface, and on this wiring pattern on the chip packaging surface is provided an insulating material for ensuring insulation from the semiconductor chip with an inner joining area that allows electric connection to the semiconductor chip being maintained thereon.

Moreover, on the surface opposite to the chip packaging surface, a through hole used for connecting the external connecting terminal is provided so as to install the external terminal that is connected to the above-mentioned wiring pattern. With respect to the wiring pattern at this portion, a land section larger than the through hole is formed so as to cover the through hole.

The semiconductor chip is provided with an electrode on its surface, and the rear surface thereof is joined to the chip packaging surface. The semiconductor chip is connected to the wiring on the insulating wiring substrate by wire, and the semiconductor chip and the wire are sealed by resin on the insulating wiring substrate. Moreover, a terminal used for external connection is provided inside the through hole.

The resin-sealing type semiconductor device of the BGA type adopts a structure in which: the semiconductor chip is packaged on the insulating wiring substrate, and after an electrical conduction has been ensured between the wiring pattern and the semiconductor chip, these are sealed with resin. Then, the ball-shaped terminal, which is an external terminal, is attached thereto. In most cases, this ballshaped terminal is made of solder, and is subjected to a heating treatment in a reflow furnace or the like, so as to form the terminal.

Moreover, such a resin-sealing type semiconductor device is often packaged simultaneously with other packaging parts when the semiconductor chip is packaged on the insulating wiring substrate by the user; therefore, at this time, this is also subjected to a heating treatment by a reflow furnace or the like. For this reason, bubbles and moisture, located in the interface between the insulating wiring substrate and the semiconductor chip, expand due to heat, thereby causing separation, swelling, etc. of the resin.

As described above, defects tend to occur in the resin-sealing type semiconductor device of BGA type due to swelling caused by heat at the time of assembling and packaging.

In order to solve the above-mentioned problems, Japanese Laid-Open Utility Model Application No. 51449/1988 (Jitsukaishou 63-51449) (Published on Apr. 7, 1988) has proposed an arrangement, although this relates to a type different from the CSP structure of the BGA type. In this arrangement, as illustrated in FIGS. 8(*a*) and 8(*b*), a through hole 102 is provided in a chip packaging section 101 of a packaging substrate 100 so that the generation of bubbles at the joining section between the chip and the packaging substrate 100 is prevented.

Therefore, as illustrated in FIGS. 9(*a*) and 9(*b*), when the arrangement of Japanese Laid-Open Utility Model Application No. 51449/1988 is applied to the CSP structure of the BGA type, a through hole 25 for drawing air with a smaller diameter is provided on the insulating substrate 26 at a position without a wiring pattern 22.

However, in the above-mentioned method, since the through hole 25 for drawing air is provided in the insulating substrate 26, the through hole 25 tends to intersect the wiring pattern 22. Here, from the viewpoint of reliability of the semiconductor device, it is not desirable to have an intersection between the through hole 25 and the wiring pattern 22. In order to avoid the intersection between the through hole 25 and the wiring pattern 22, as illustrate in FIG. 8, a portion having no wiring pattern needs to be provided on the periphery of the through hole 25 of the insulating substrate 26. This portion also needs to be provided with a large area to a certain extent by taking into consideration the pattern positional precision and the machining precision of the position of the through hole 25 for drawing air. For this reason, the application of the above-mentioned arrangement further limits the degree of freedom in designing the wiring pattern 22.

Moreover, although it is desirable to form the through holes 25 for drawing air in a uniform manner over the packaging portion of the semiconductor chip, the above-mentioned arrangement sometimes makes it impossible to make such a formation due to difficulties encountered in designing the wiring pattern 22. Moreover, it is necessary to provide a more difficult machining process so as to form the through holes 25 for drawing air with such a small diameter; this results in an increase in the manufacturing cost of the insulating substrate 26.

SUMMARY OF THE INVENTION

The present invention has been devised to solve the above-mentioned problems, and its objective is to provide a wiring substrate used for a resin-sealing type semiconductor device which can easily provide holes for eliminating adverse effects due to bubbles and moisture located in the interface between a wiring substrate used for a resin-sealing type semiconductor device and a semiconductor chip to be packaged thereon, at positions covering a wider area on the above-mentioned substrate without sacrifice of degree of freedom in designing the wiring pattern, and a resin-sealing type semiconductor device structure using such a wiring substrate.

In order to achieve the above-mentioned objective, the wiring substrate used for a resin-sealing type semiconductor device of the present invention is provided with an insulating substrate in which a through hole used for connecting an external terminal is formed, a wiring pattern formed on a semiconductor-chip packaging surface side of the insulating substrate, a land section that is formed at an end of the wiring pattern in a manner so as to cover the through hole from the semiconductor-chip packaging surface side, and that is used for connecting the external connecting terminal to the wiring pattern from the surface side opposite to the above-mentioned semiconductor-chip packaging surface side of the insulating substrate, and a through-hole opening section that allows the through hole to be partially open on the semiconductor-chip packaging surface side.

With this arrangement, when a wiring substrate used for a resin-sealing type semiconductor device is applied, a semiconductor chip is packaged on the semiconductor-chip packaging surface side thereof, and this packaging surface side is sealed by resin. Moreover, an external connecting terminal is inserted in the through hole for connecting the external connecting terminal of the insulating substrate from the surface side opposite to the above-mentioned semiconductor-chip packaging surface side, and connected to the land section of the wiring pattern.

In this state, the external connecting terminal, made of, for example, a solder ball, has not been connected to the insulating substrate yet, and there is a gap between the external connecting terminal and the through hole. Moreover, the above-mentioned through hole is partially open to the semiconductor-chip packaging surface side through the through-hole opening section. Therefore, even if air and moisture exist between the wiring substrate used for a resin-sealing type semiconductor device and the semiconductor chip, the air and moisture is discharged outward through the through-hole opening section as well as the gap between the external connecting terminal and the through hole when the semiconductor device is heated. Thus, it becomes possible to prevent swelling and separation of the resin due to the above-mentioned air and moisture.

Here, since the arrangement for discharging the air and moisture is made by utilizing the through hole for connecting the external terminal formed in the insulating substrate, it is not necessary to sacrifice the degree of freedom in designing the wiring pattern. Moreover, the above-mentioned arrangement can be easily provided in a wider range by setting the through holes in the wider range in the wiring substrate for a resin-sealing type semiconductor device.

In other words, it becomes possible to improve the reliability of the reflow resistance at low costs without imposing a limitation to the wiring pattern.

Moreover, the resin-sealing type semiconductor device structure of the present invention is provided with: a wiring substrate used for a resin-sealing type semiconductor device having an insulating substrate in which a through hole used for connecting an external terminal is formed, a wiring pattern formed on a semiconductor-chip packaging surface side of the insulating substrate, a land section that is formed at an end of the wiring pattern in a manner so as to cover the through hole from the semiconductor-chip packaging surface side, and a through-hole opening section that allows the through hole to be partially open on the semiconductor-chip packaging surface side; a semiconductor chip that is assembled on the semiconductor-chip packaging surface side of the wiring substrate used for a resin-sealing type semiconductor device and connected to the wiring pattern; a resin sealing section for sealing the semiconductor-chip packaging surface side of the wiring substrate used for a resin-sealing type semiconductor device; and an external connecting terminal that is connected to the land section through the through hole from the surface side opposite to the above-mentioned semiconductor-chip packaging surface side in the wiring substrate used for a resin-sealing type semiconductor device.

As described above, the resin-sealing type semiconductor device structure of the present invention uses the above-mentioned wiring substrate used for a resin-sealing type semiconductor device; therefore, it is possible to easily provide holes for eliminating adverse effects due to bubbles and moisture located in the interface between a wiring substrate used for a resin-sealing type semiconductor device and the semiconductor chip, at positions covering a wider area on the above-mentioned substrate without sacrifice of degree of freedom in designing the wiring pattern.

For a fuller understanding of the nature and advantages of the invention, reference should be made to the ensuing detailed description taken in conjunction with the accompanying drawings.

Figure 6A:
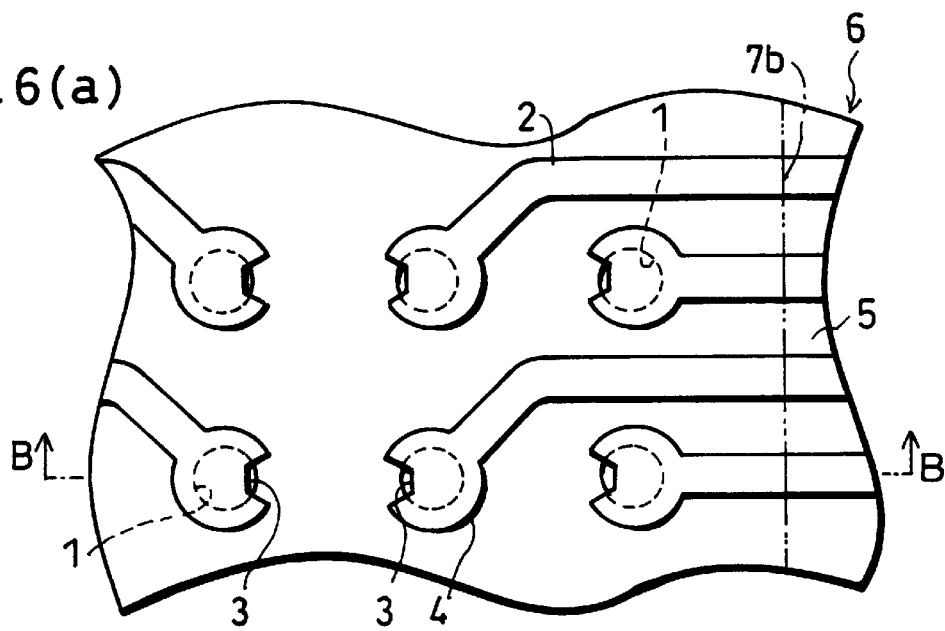
FIG. 6(a) is a plan view that shows a state in which an insulating film is formed on the wiring substrate used for a resin-sealing type semiconductor device of FIG. 1.

FIG.. 6(b) is a cross-sectional view taken along line B—B of FIG. 6(a).

Figure 7A:
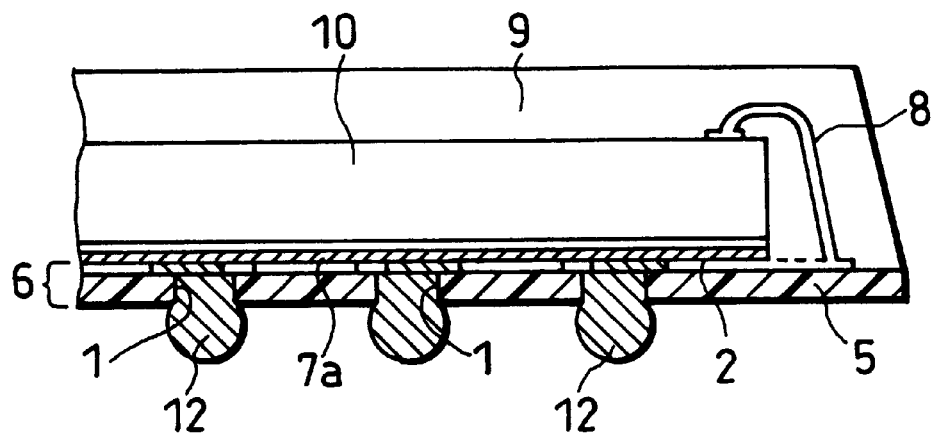

FIG. 7(a) is a longitudinal cross-sectional view of a resin-sealing type semiconductor device in accordance with one embodiment of the present invention.

Figure 7B:
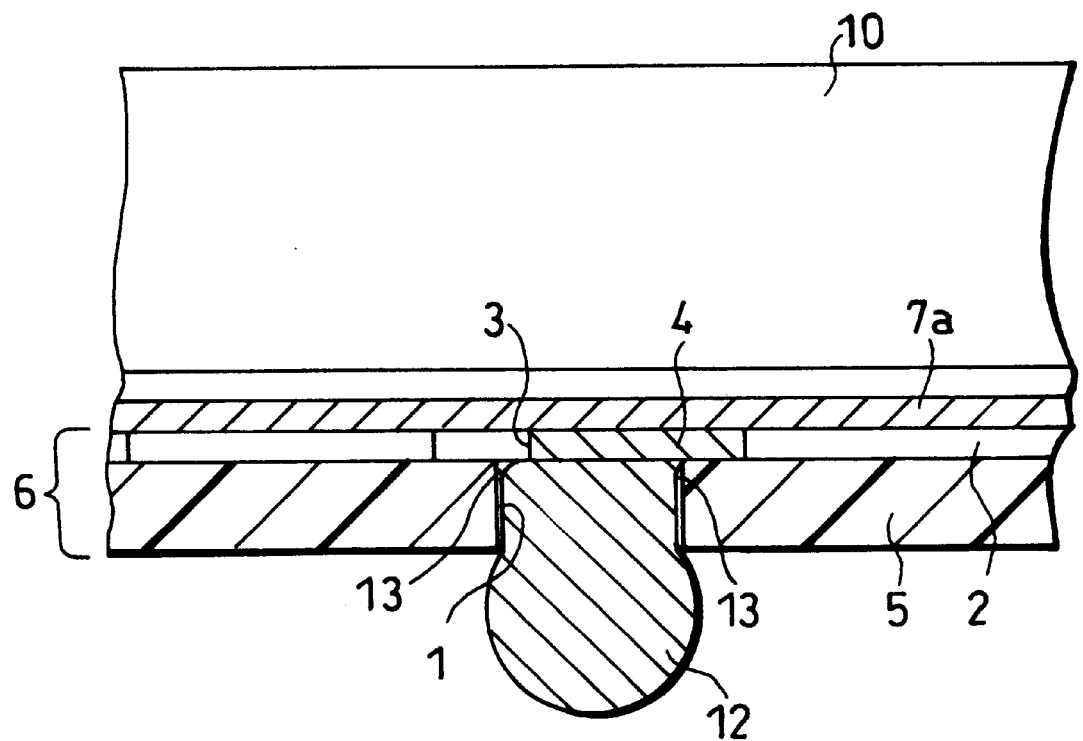

FIG. 7(b) is an enlarged view showing the external terminal of FIG. 7(a) and the vicinity thereof.

Figure 8A:
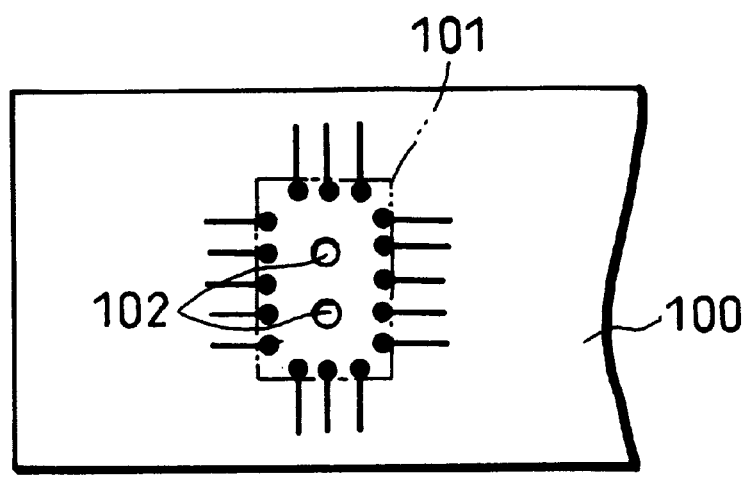

FIG. 8(a) is a plan view that shows a portion of a conventional wiring substrate used for a resin-sealing type semiconductor device.

Figure 8B:
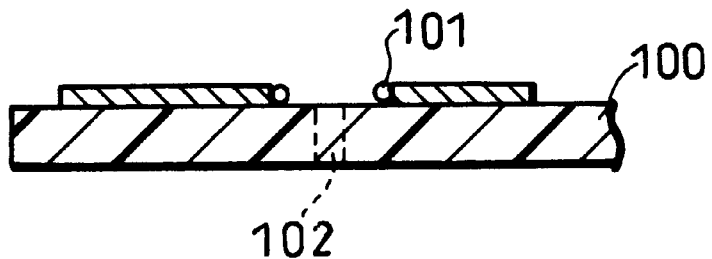

FIG. 8(b) is a longitudinal cross-sectional view of FIG. 8(a).

Figure 9A:
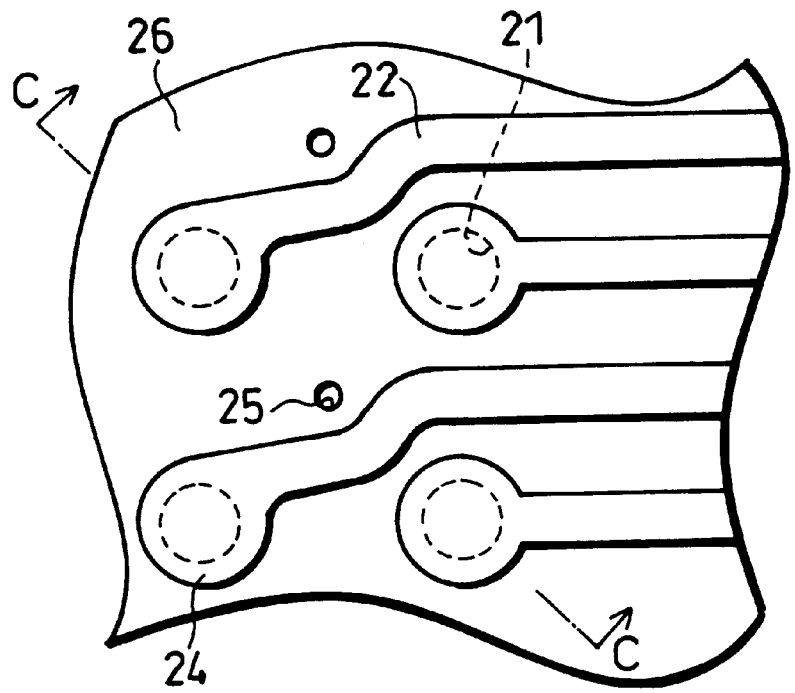

FIG. 9(a) is a plan view that shows a portion of another conventional wiring substrate used for a resin-sealing type semiconductor device.

Figure 9B:
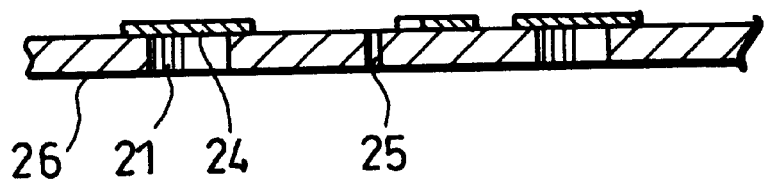

FIG. 9(b) is a cross-sectional view taken along line CC of FIG. 9(a).

DESCRIPTION OF THE EMBODIMENTS

Referring to FIGS. 1 through 7, the following description will discuss one embodiment of the present invention.

As illustrated in FIGS. 7(a) and 7(b), in the resin-sealing type semiconductor device structure of the present embodiment, a semiconductor chip 10 is assembled on a wiring substrate used for a resin-sealing type semiconductor device 6 (hereinafter, referred to simply as a wiring substrate) through an insulating material layer 7a, the semiconductor chip 10 is connected to the wiring substrate 6 through an electric-connection wire 8, and the semiconductor chip 10 including the electric-connection wire 8 is sealed by a resin-sealing section 9. The wiring substrate 6 is constituted by an insulating base plate 5 and a wiring pattern 2 formed thereon, and an external terminal 12 is provided in an external-terminal connecting through hole 1 formed in the insulating base plate 5.

With respect to the material for the insulating base plate 5 of the wiring substrate 6, any material may be adopted as long as it is superior in heat resistance, insulating property, strength and dimension stability. Examples of materials having such properties include polyimide, polyamide, BT (bismaleate·triazine) resin, epoxy, polyester, glass epoxy, glass polyimide, ceramics, etc. From the viewpoint of costs and ease of machining, it is preferable to use polyimide. Polyimide has an insulating resistivity of approximately $5 \times 10^{13}$ Ω.

Moreover, with respect to the material for the wiring pattern 2, those having a conductive property and a heat resistant property are used, and in general, metal materials are used. From the viewpoint of costs, Copper (Cu) is preferably used. Although not particularly limited, the thickness of the wiring pattern 2 is preferably set at 12 μm, 18 μm or 25 μm.

The insulating material layer 7a is used for ensuring the insulating characteristic between the semiconductor chip 10 and the wiring pattern 2. With respect to the formation method of the insulating material layer 7a, a method in which a film sheet is affixed onto the wiring pattern 2 is proposed. Further, another method is proposed in which a film-shaped insulating material layer 7a is formed on the back surface of the semiconductor chip 10 in the case when the semiconductor chip 10 is assembled on the wiring substrate 6 with its face up. With respect to the material for the insulating material layer 7a, either a thermoplastic or a thermosetting resin material may be used.

For example, in the case of the application of the wiring substrate 6 to which a thermoplastic film has been affixed as the insulating material layer 7a, the semiconductor chip 10 is secured to the wiring substrate 6 by applying heat at the time of assembling the semiconductor chip 10 on the wiring substrate 6. Moreover, in the case when the semiconductor chip 10 is assembled on the wiring substrate 6 with its face up, an insulating material is preliminarily formed on the back surface of the semiconductor chip 10, and the semiconductor chip 10 may be secured by heating the insulating material at the time of assembling the semiconductor chip 10.

Moreover, with respect to the insulating material layer 7a, a film-shaped insulating material and a paste bonding agent may be used in a combined manner. For example, the wiring substrate 6 is formed by affixing a film insulating material onto the wiring pattern 2, and to this is applied an insulating resin paste as a bonding agent so as to secure the semiconductor chip 10.

With respect to the material for the resin-sealing section 9, any resin may be used as long as it has properties such as a shape-retaining property, a molding property, a moisture resistant property, and a heat resistant property. In general, a mixture containing resins such as epoxy, silicone, phenol, etc. as base materials is used; and from the viewpoint of reliability, it is preferable to use an epoxy resin.

The external terminal 12 is formed by attaching solder in the form of a ball. With respect to the ball-shaped solder to be attached, those all made of solder, those formed by applying solder plating to copper balls, etc., are used. With respect to the compositions of the solder, those made of eutectic crystal and those containing additives, such as silver and antimony, are listed.

With respect to the electric-connection wire 8, various materials may be used as long as they have superior electrical conductivity. For example, gold, copper, etc. may be used, and among these, from the viewpoint of wire looping property and electrical conductivity, it is preferable to use gold. Here, in the case when a flip-chip type connection is made so as to connect the semiconductor chip 10 to the wiring substrate 6 with its face down, no electric-connection wire 8 is used. In this case, in the insulating material layer 7a, the connecting area between the semiconductor chip 10 and the wiring pattern 2 is allowed to be open.

Next, referring to FIGS. 1(a) and 1(b), an explanation will be given of the wiring substrate 6 in detail.

In the wiring substrate 6 of the present embodiment, a polyimide base member, which is formed by applying a polyimide adhesive agent having superior heat resistance to its wiring pattern formation side, is used as the insulating base plate 5. The polyimide base member has a thickness of 50 μm or 75 μm and the adhesive agent for laminating copper foil used to form the wiring pattern 2 has a thickness of approximately 7 to 12 μm.

Prior to laminating the copper foil, the external-terminal connecting through hole 1 is preliminarily provided in the insulating base plate 5 by a process using a drill or a mold. Here, the adhesive agent may be applied to both of the sides of the insulating base plate 5 so as to prevent warping of the wiring substrate 6.

Next, the copper foil for forming the wiring pattern 2 is laminated on the insulating base plate 5. With respect to the copper foil, that having a thickness of 18 Am was used. After the copper foil has been laminated, the wiring pattern 2 is formed in a manner so as to fit the position of the external-terminal connecting through hole 1. Etching is used as the formation method. Taking into consideration the conformity of the wire bonding, after the wiring pattern 2 has been formed, gold plating having a thickness of approximately 0.6 μm is applied the surface thereof. This plating is applied to an exposed portion of the copper foil in the external-terminal connecting through hole 1 on the semiconductor-chip packaging surface side.

In the interface between the copper and the gold, nickel plating having a thickness of approximately 5 μm and palladium plating having a thickness of approximately 0.4 μm are interpolated so as to prevent mutual dispersion of the copper and the solder which takes place when the external terminal 12 made of solder is attached to the external-terminal fixing surface of the wiring pattern 2. Either electroless plating or electrolysis plating may be used as the method of the above-mentioned plating processes. Here, in the case of electrolysis plating, wiring is required for the plating, and the wiring sticks out of the resin-sealing type semiconductor device in a finished shape; this necessitates that the wiring be cut. Since the cut face of the wiring is exposed when the wiring has been cut, electroless plating was carried out in the plating process in the present invention.

A wiring section for external connection (hereinafter, referred to as a land section) 4 in the wiring pattern 2 is formed on the external-terminal connecting through hole 1 in a manner so as to cover the external-terminal connecting through hole 1. In this case, it is necessary to make the land section 4 larger than the external-terminal connecting through hole 1. The size of the land section 4 in relation to the external-terminal connecting through hole 1 has an influence on the joining strength of the land section 4 within the wiring pattern; thus, the required size is determined by the positional precision between the wiring pattern 2 including the land section 4 and the external-terminal connecting through hole 1. Taking into consideration the current manufacturing technique, etc., the land section 4 is preferably placed not less than 70 μm outside the edge of the external-terminal connecting through hole 1, that is, with a comparatively large size. In the present embodiment, this size was set at 100 μm.

Figure 1A:
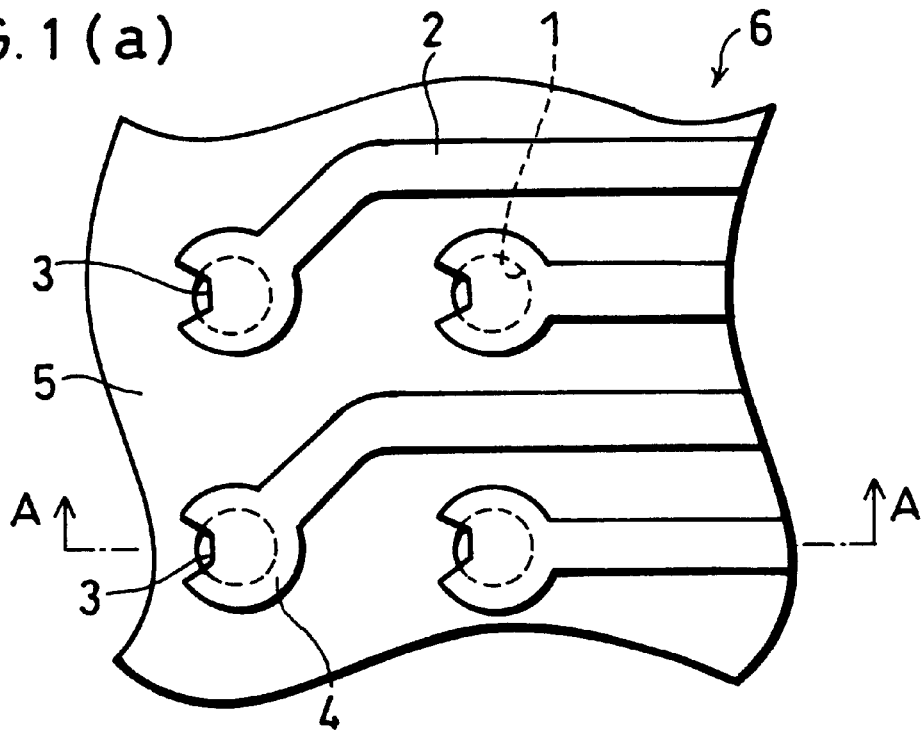
FIG. 1(a) is a plan view that shows a portion of a wiring substrate used for a resin-sealing type semiconductor device in accordance with one embodiment of the present invention.

With respect to the land section 4 covering the external-terminal connecting through hole 1, a notch is formed therein as illustrated in FIG. 1(a) so that the pattern edge is allowed to enter the external-terminal connecting through hole 1, and patterning is made so that a portion of the external-terminal connecting through hole 1 that is not covered with the land section 4 is allowed to form a through-hole open section 3. It is only necessary for the through-hole open section 3 to have a partial penetrating portion so as to allow air to pass through it. Further, in order to prevent a reduction in the joining strength between the land section 4 and the external terminal 12, the through-hole open section 3 is preferably set to have a size not more than 10% of the opening area of the external-terminal connecting through hole 1.

In the present embodiment, a notch, which has an angle of 60° with respect to the center of the land 4, is formed in the land section 4 so as to extend further inside the edge of the external-terminal connecting through hole 1. In this case, the shape of the land section 4 and the shape of the notch are not particularly limited, and any shape may be used as long as the notch of the land section 5 reaches the external-terminal connecting through hole 1. In other words, it is only necessary to form a portion (the through-hole open section 3) at which the external-terminal connecting through hole 1 is not covered with the land section 4 on the chip packaging surface side on the insulating base plate 5.

Figure 2:
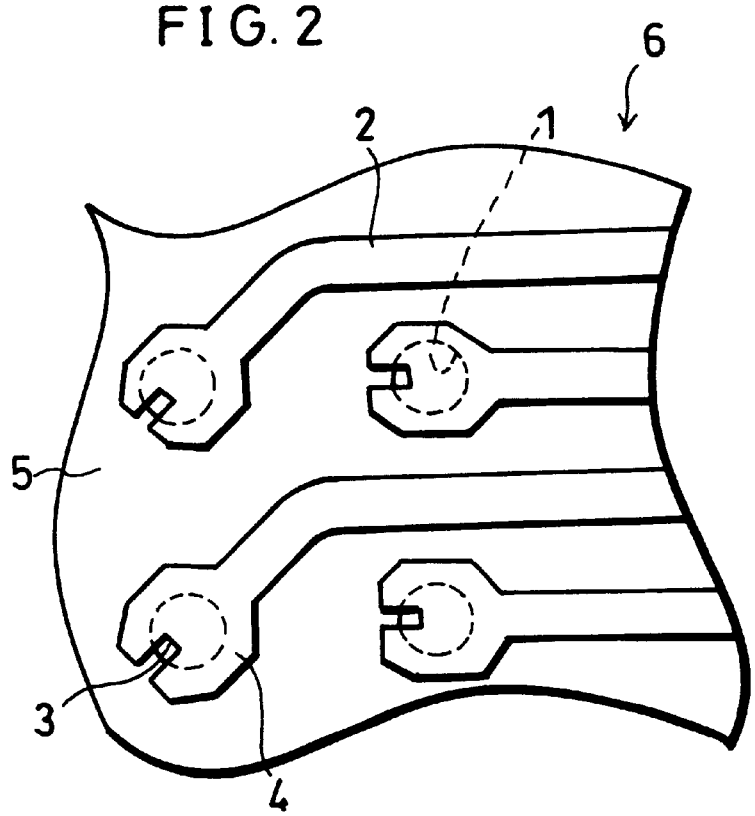
FIG. 2 is a plan view that shows a portion of a wiring substrate used for a resin-sealing type semiconductor device in accordance with another embodiment of the present invention.
Figure 3:
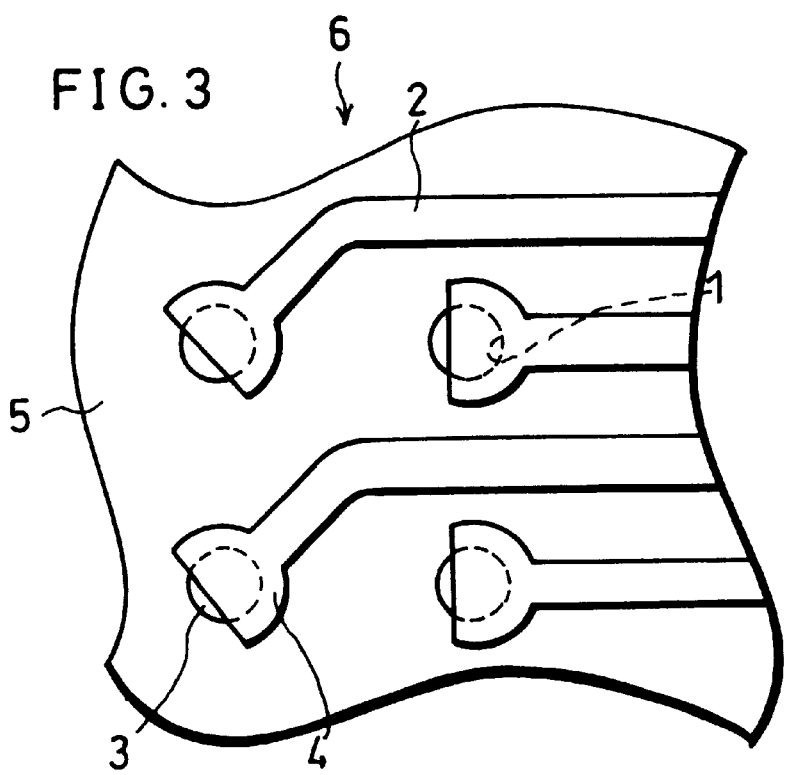
FIG. 3 is a plan view that shows a portion of a wiring substrate used for a resin-sealing type semiconductor device in accordance with still another embodiment of the present invention.

Therefore, as illustrated in FIG. 2, in order to form the through-hole open section 3, the land section 4 may have a polygon shape with a rectangular notch. Alternatively, as illustrated in FIG. 3, the land section 4 may have a notched shape lacking one portion thereof so that the through-hole open section 3 that is not covered with the land section 4 is provided.

Figure 4:
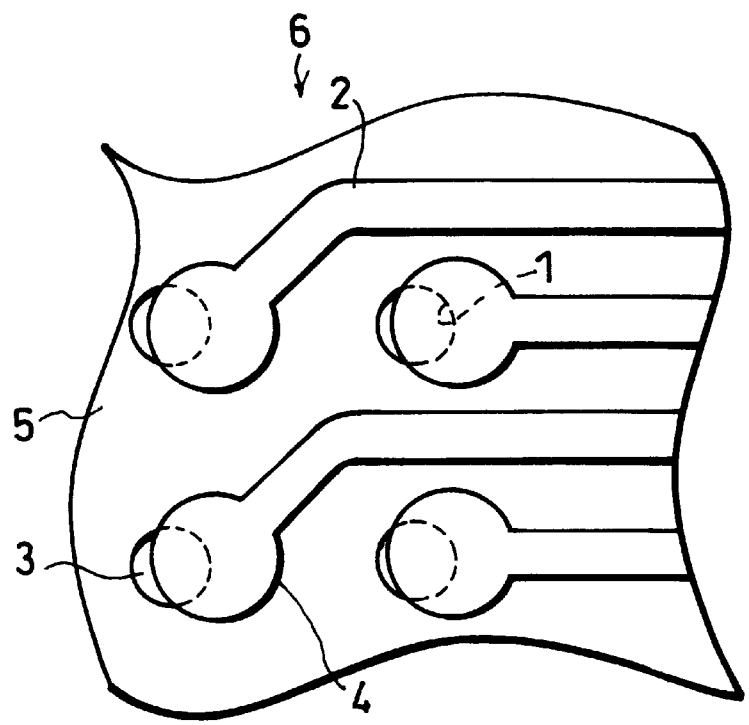
FIG. 4 is a plan view that shows a portion of a wiring substrate used for a resin-sealing type semiconductor device in accordance with still another embodiment of the present invention.

Moreover, as illustrated in FIG. 4, the external-terminal connecting through hole 1 and the land section 4 may be placed with an offset in their relative positional relationship, with the result that the external-terminal connecting through hole 1 extends outside the land section 4 so as to form the through-hole open section 3 that is not covered with the land section 4.

Figure 5:
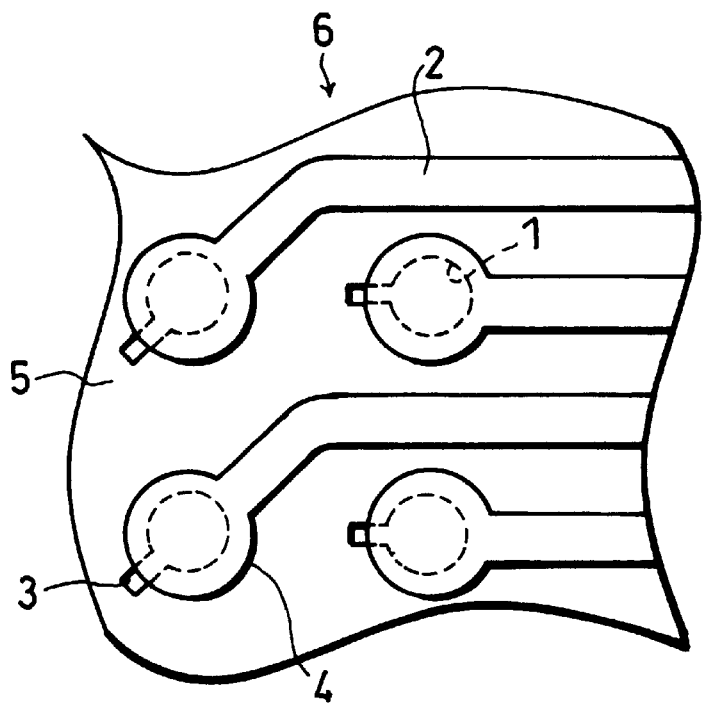
FIG. 5 is a plan view that shows a portion of a wiring substrate used for a resin-sealing type semiconductor device in accordance with still another embodiment of the present invention.

Furthermore, as illustrated in FIG. 5, the external-terminal connecting through hole 1 may be provided as a rectangular hole so that the external-terminal connecting through hole 1 is allowed to extend outside the land section 4 so as to form the through-hole open section 3 that is not covered with the land section 4.

Among the shapes shown in FIGS. 1 through 5, in order to prevent a reduction in the external-terminal connecting strength by covering the edge of the external-terminal connecting through hole 1 with an area larger than the land section 4, those shapes shown in FIG. 1 and FIG. 2 are preferably used.

Figure 6B:
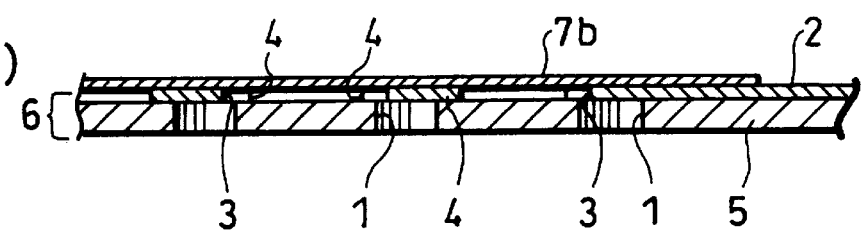

Moreover, in the cases shown in FIGS. 6(a) and 6(b), all portions of the wiring pattern 2 of the wiring substrate 6 are exposed; however, an insulating film 7b, which forms the insulating material layer 7a, may be formed on the semiconductor-chip packaging surface side of the wiring substrate 6. By preliminarily forming the insulating film 7b, it becomes possible to eliminate the necessity of forming the insulating material layer 7a during the package-assembling process, and consequently to reduce the number of processes.

With respect to the formation method of the insulating film 7b, it is preferable to adopt a method in which a film sheet is positioned on a portion to cover the wiring pattern 2, and affixed thereto so as to form the insulating film 7b. In this case, the insulating film 7b is formed in a manner so as to avoid the portion of the wiring pattern 2 that is electrically joined to the semiconductor chip 10. In the present embodiment, the insulating film 7b, which has the same size as the semiconductor chip 10, was affixed thereto.

With respect to the material for the insulating film 7b, either a thermoplastic or a thermosetting material may be used. In the present embodiment, a thermoplastic material was used. More specifically, a mixed material of polyimide and epoxy was used. The thickness of this film was set at 15 μm.

Moreover, the above-mentioned film was affixed to the wiring pattern 2 so as not to contact the insulating base plate 5, thereby allowing aqueous vapor to easily escape after sealing with resin. In this case, those shapes of the external-terminal connecting through hole 1 and the land 4 shown in FIG. 1 were adopted; instead of these, those shown in FIGS. 2 through 5 may be utilized.

The resin-sealing type semiconductor device structure of the present embodiment is designed as follows: the semiconductor chip 10 is assembled on the wiring substrate 6 through the insulating material layer 7a, the circuit on the surface of the semiconductor chip 10 is electrically connected to the wiring substrate 6 through the metal connection wire 8, and the resin-sealing section 9 seals the outside of these members. Moreover, a solder ball, used for external connection, is placed on the land section 4 of the wiring pattern 2 of the wiring substrate 6 on its surface opposite to the semiconductor-chip packaging surface so as to form an external terminal 12 in the external-terminal connecting through hole 1; thus, the wiring substrate 6 is cut off in accordance with the outer dimension of the semiconductor chip 10 so as to form individual pieces.

Next, an explanation will be given of a manufacturing process of the resin-sealing type semiconductor device using the above-mentioned wiring substrate 6.

Figure 1B:
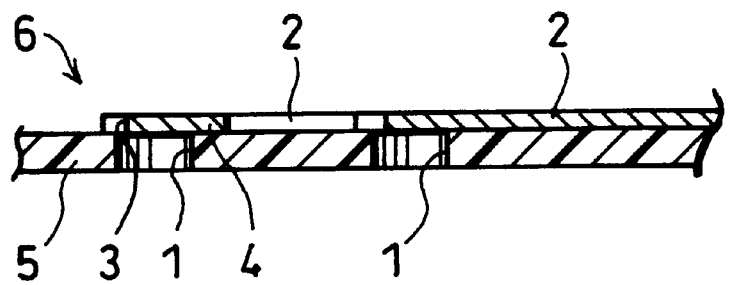
FIG. 1(b) is a cross-sectional view taken along line A—A in FIG. 1(a).

First, as illustrated in FIG. 7, a semiconductor chip 10 is placed on the semiconductor-chip packaging surface (the upper surface) of the wiring substrate 6 shown in FIG. 1(b) with its back surface facing the semiconductor-chip packaging surface (in the case of the face-up structure).

In this case, a film made of an insulating material having an adhesive property is affixed to the back surface of each semiconductor chip 10. With respect to the formation method of this film, when the semiconductor chips 10 are in a wafer state, an insulating film is affixed to the entire back surface of the wafer, and upon cutting the semiconductor chips 10 into individual pieces, the film is also cut simultaneously. The semiconductor chip having the insulating film affixed to its back surface, formed as described above, is attached to a predetermined position of the wiring substrate 6 as described above. At this time, heat is applied to the wiring substrate 6 so as to utilize the adhesive property of the insulating film.

Next, the semiconductor chip 10 is electrically connected to the wiring substrate 6 by wire bonding. Upon carrying out the wire bonding, a gold wire was used as the electric-connection wire 8. By taking into consideration the heat resistance of the wiring substrate 6, the application of heat upon wire bonding was set at 180 to 200° C.

Moreover, a resin sealing was made with a resin-sealing section 9 so as to cover the semiconductor-chip packaging surface side on the wiring substrate 6 with the electric-connection wire 8 included therein. With respect to the sealing resin, an epoxy thermosetting resin was used. After the resin sealing, a mark was provided on its surface and a main curing process was carried out.

Next, a solder ball having a predetermined size is attached by using flux to the external-terminal connecting through hole 1 on the surface of the insulating base plate 5 opposite to the resin-sealing surface of the wiring substrate 6. Thereafter, the solder ball is anchored in a reflow furnace under a nitrogen atmosphere so as to form the external terminal 12.

At this time, the external terminal 12 is joined to the copper foil on the land section 4 in the wiring pattern 2 through the external-terminal connecting through hole 1. Here, since the solder does not adhere to the polyimide insulating material, the solder ball that is to form the external terminal 12 does not adhere to the area at which the insulating base plate 5 is exposed. Therefore, as shown in the enlarged view of FIG. 7(b), a gap section 13 is located between the solder ball (the external terminal 12) and the insulating base plate 5. This arrangement allows air and moisture to escape through the gap section 13, thereby making it possible to prevent swelling and separation of the resin-sealing type semiconductor device due to heat applied by the user at the time of packaging.

Lastly, the resin-sealing type semiconductor devices are cut into individual pieces in accordance with a predetermined outer dimension, thereby providing each resin-sealing type semiconductor device.

In the case when the insulating film 7b is installed on the upper surface of the wiring substrate 6, the semiconductor chip 10 is left with nothing installed on its back surface. Then, in order to utilize the adhesive property of the insulating film 7b installed on the wiring substrate 6, the wiring substrate 6 is heated, and in this state, the semiconductor chip 10 is placed on the wiring substrate 6 and pressed onto the wiring substrate 6 so as to be bonded thereto. After the press-bonding process, this is subjected to a main curing process so that the semiconductor chip 10 is completely secured thereon. Then, after having been subjected to the above-mentioned processes, the resin-sealing type semiconductor device is completed.

In the case when no heat-applying mechanism is provided in the die-bonding device at the time of packaging the semiconductor chip 10, a bonding paste may be applied to the insulating material layer 7a and, after the semiconductor chip 10 has been attached onto the paste, this may be subjected to a batch curing process.

In this embodiment, an explanation was given of a case in which the semiconductor chip 10 is packaged on the wiring substrate 6 with its face up; however, the semiconductor chip 10 may be packaged with its face down without wires by using the flip-chip type structure. In this case, a conventional flip-chip bonding method of the face-down system may be adopted in which a metal bump is formed on each of electrodes of the semiconductor chip 10 and this bump is electrically connected to an inner resistor area on the wiring substrate 6. The other manufacturing processes and materials are the same as those described earlier.

The wiring substrate of the present invention is provided with an insulating layer that is formed in an area other than the connecting area between a wiring pattern and a semiconductor chip and allowed to contact only the wiring pattern.

Moreover, the resin-sealing type semiconductor device of the present invention is provided with an insulating layer that is placed between a semiconductor chip and a wiring substrate and that allows only the connecting terminal of the semiconductor chip to be electrically connected to a wiring pattern.

With these arrangements of the insulating layers, it becomes possible to remove aqueous vapor, which resides between the semiconductor chip and the wiring substrate after the resin-sealing process, outward more positively.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A wiring substrate used for a resin-sealing type semiconductor device comprising:

an insulating substrate in which a through hole used for connecting an external terminal is formed, a wiring pattern formed on a semiconductor-chip packaging surface side of the insulating substrate;

a land section that is formed at an end of the wiring pattern in a manner so as to cover the through hole from the semiconductor-chip packaging surface side, and that is used for connecting the external connecting terminal to the wiring pattern from the surface side opposite to the above-mentioned semiconductor-chip packaging surface side of the insulating substrate; and a through-hole opening section that allows the through hole to be partially open on the semiconductor-chip packaging surface side.

2. The wiring substrate used for a resin-sealing type semiconductor device as defined in claim 1, wherein said through-hole opening section is provided by forming the land section into a notched shape.

3. The wiring substrate used for a resin-sealing type semiconductor device as defined in claim 1, wherein said through-hole opening section is provided by forming the land section to have an offset between the center thereof and the center of the through hole.

4. The wiring substrate used for a resin-sealing type semiconductor device as defined in claim 1, wherein said through-hole opening section is provided by forming a deformed section in the through hole in the diameter direction thereof.

5. The wiring substrate used for a resin-sealing type semiconductor device as defined in claim 1, further comprising:

an insulating layer that is formed in an area other than a connecting area between the wiring pattern and the semiconductor chip and allowed to contact only the wiring pattern.

6. A resin-sealing type semiconductor device structure comprising:

a wiring substrate used for a resin-sealing type semiconductor device having an insulating substrate in which a through hole used for connecting an external terminal is formed, a wiring pattern formed on a semiconductor-chip packaging surface side of the insulating substrate, a land section that is formed at an end of the wiring pattern in a manner so as to cover the through hole from the semiconductor-chip packaging surface side, and a through-hole opening section that allows the through hole to be partially open on the semiconductor-chip packaging surface side;

a semiconductor chip that is assembled on the semiconductor-chip packaging surface side of the wiring substrate used for a resin-sealing type semiconductor device and connected to the wiring pattern;

a resin sealing section for sealing the semiconductor-chip packaging surface side of the wiring substrate used for a resin-sealing type semiconductor device including the semiconductor chip; and an external connecting terminal that is connected to the land section through the through hole from the surface side opposite to the above-mentioned semiconductor-chip packaging surface side in the wiring substrate used for a resin-sealing type semiconductor device.

7. The resin-sealing type semiconductor device structure as defined in claim 6, wherein an insulating layer that is placed between the semiconductor chip and the wiring substrate and that allows only a connecting terminal of the semiconductor chip to be electrically connected to the wiring pattern.

8. The resin-sealing type semiconductor device structure as defined in claim 7, wherein said insulating layer has a surface on a side opposite to the semiconductor chip side, which contacts only the wiring pattern.

9. The resin-sealing type semiconductor device structure as defined in claim 6, wherein said through-hole opening section of the wiring substrate used for the resin-sealing type semiconductor device is provided by forming the land section to have an offset between the center thereof and the center of the through hole.

10. The resin-sealing type semiconductor device structure as defined in claim 6, wherein said through-hole opening section of the wiring substrate used for the resin-sealing type semiconductor device is provided by forming a deformed section in the through hole in the diameter direction thereof.

11. The resin-sealing type semiconductor device structure as defined in claim 6, further comprising:

an insulating layer that is formed in an area other than a connecting area between the wiring pattern of the wiring substrate used for the resin-sealing type semiconductor device and the semiconductor chip, and allowed to contact only the wiring pattern.

* * * * *